United States Patent
Hess

(10) Patent No.: US 9,528,815 B2
(45) Date of Patent: Dec. 27, 2016

(54) TRANSFORMER BASED SENSOR ARRANGEMENT

(71) Applicant: Hamilton Sundstrand Corporation, Windsor Locks, CT (US)

(72) Inventor: Gary L. Hess, Enfield, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 673 days.

(21) Appl. No.: 13/762,486

(22) Filed: Feb. 8, 2013

(65) Prior Publication Data

US 2014/0225599 A1    Aug. 14, 2014

(51) Int. Cl.
*G01B 7/14* (2006.01)
*G01D 5/20* (2006.01)
*G01R 23/02* (2006.01)

(52) U.S. Cl.
CPC ............... *G01B 7/14* (2013.01); *G01D 5/2046* (2013.01); *G01R 23/02* (2013.01)

(58) Field of Classification Search
USPC ............ 324/207.15, 633, 207.18, 207.16, 652,324/655, 126, 207.24, 239, 537, 654, 682,324/76.41, 76.51; 340/646; 702/64, 150, 75; 331/15; 323/247; 363/21.02
See application file for complete search history.

(56) References Cited

U.S. PATENT DOCUMENTS

| | | | |
|---|---|---|---|
| 3,953,771 A * | 4/1976 | Bremstahler | 361/293 |
| 4,030,085 A * | 6/1977 | Ellis | G01D 5/22 340/870.36 |
| 4,514,689 A * | 4/1985 | Gerard | 324/207.18 |
| 4,591,795 A * | 5/1986 | McCorkle | 327/104 |
| 4,904,921 A | 2/1990 | DeVito et al. | |
| 5,777,468 A * | 7/1998 | Maher | 324/207.18 |
| 6,469,418 B1 | 10/2002 | Katerberg et al. | |
| 6,811,376 B2 | 11/2004 | Arel et al. | |
| 7,248,994 B1 | 7/2007 | Stolan | |
| 7,395,044 B2 | 7/2008 | Horikawa | |
| 2005/0033819 A1 | 2/2005 | Gambino et al. | |
| 2005/0046593 A1* | 3/2005 | Tulpule et al. | 340/870.36 |
| 2007/0103248 A1* | 5/2007 | Nakamura | H03D 3/007 331/167 |
| 2007/0233912 A1* | 10/2007 | Piasecki | H03K 3/0231 710/61 |
| 2011/0227556 A1* | 9/2011 | Ivchenko et al. | 323/318 |

(Continued)

FOREIGN PATENT DOCUMENTS

EP      2080993     7/2009
WO      2006016147  2/2006

OTHER PUBLICATIONS

Rotary Variable Differential Transformer, available at http://en.wikipedia.org/wiki/Rotary_variable_differential_transformer on Sep. 13, 2006.*

(Continued)

*Primary Examiner* — Melissa Koval
*Assistant Examiner* — Nasima Monsur
(74) *Attorney, Agent, or Firm* — Carlson, Gaskey & Olds, P.C.

(57) ABSTRACT

A position sensor arrangement has a transformer based position sensor and a cable peaking correction apparatus. The cable peaking correction apparatus is controllably coupled to a transformer based position sensor excitation input or the outputs from the transformer based position sensor. A signal processing system is connected to multiple outputs from the transformer based position sensor arrangement.

16 Claims, 4 Drawing Sheets

(56) References Cited

U.S. PATENT DOCUMENTS

2013/0177172 A1* 7/2013 Dodd ............... G10H 1/32
381/98

OTHER PUBLICATIONS

Resolver, available at http://en.wikipedia.org/wiki/Resolver_(electrical) on Feb. 2, 2012.*
Application Note, LVDT selection, handling and installation guidelines (Application Note), Oct. 2012, available at http://www.disensors.com/downloads/products/LVDT%20handling%20and%20installation%20guideline_1345.pdf.*
RLC circuit, available at http://en.wikipedia.org/wiki/RLC_circuit on Feb. 28, 2012.*
ATA-2001 LVDT Amplifier, 2006.*
AD698 Universal LVDT Signal Conditioner, Analog Devices, 1995.*
A308 Signal Conditioner/interface for LVDT sensor, available at http://www.labsystems.com/products/amplifier/a308_DIN.html on Mar. 24, 2011.*
European Search Report for Application No. 14153638.3 published on Nov. 4, 2015.

* cited by examiner

TRANSFORMER BASED SENSOR ARRANGEMENT

TECHNICAL FIELD

The present disclosure relates generally to sensor arrangements utilizing differential transformers, and more particularly to a sensor arrangement including a cable peaking correction apparatus.

BACKGROUND OF THE INVENTION

Many aircraft systems utilize linear or rotary actuators to control the position of aircraft components. In order to provide complete control over the position of the components, a sensor is typically used to sense the position of the actuator and provide the sensed information to a signal processing device such as a controller. The controller then determines appropriate adjustments to the actuator position to affect a desired adjustment to the component position.

One sensor type utilized for this type of sensing is a transformer based sensor including either shifting coils or a shifting core that shifts position along with the actuator. The shift in position of the coils or the core affects the output of the sensor in a known manner, allowing the controller to detect the output and calculate the position of the actuator. In order to achieve highly accurate sensor information from a transformer based sensor, two outputs from the sensor are detected, and the relative values of the two outputs are compared to determine the position of the actuator.

Ordinarily, differential transformer based sensors operate on a resistance-inductance (RL) circuit and do not include a capacitance. Some implementations, however, require the utilization of sensor cables of significant length that a capacitance from the cables is introduced into the sensor arrangement, resulting in a resistance-inductance-capacitance (RLC) circuit. It is similarly possible that the connections to other electrical devices or components can also add a capacitance to the sensor arrangement.

It is known in the art that RLC circuits include a cable resonance frequency resulting in a signal peak at the resonant frequency. If information is transmitted at, or close to, the resonance frequency, the peak can interfere with the information transmitted. This is referred to as cable peaking.

SUMMARY OF THE INVENTION

Disclosed is a position sensor arrangement including a transformer based position sensor, a signal processing system connected to a plurality of outputs from the transformer based position sensor, and a cable peaking correction apparatus controllably coupled to the signal processing system, wherein the cable peaking correction apparatus is coupled to at least one of a transformer based position sensor excitation input and the plurality of outputs from the transformer based position sensor.

Also disclosed is a method for correcting for cable peaking in a transformer based sensor arrangement including the step of tuning a cable peaking correction component such that a resonant frequency of the transformer based sensor arrangement does not place data from a transformer based sensor out of specified tolerances.

Also disclosed is an aircraft sensor assembly including a transformer based position sensor coupled to an aircraft component, a signal processing system connected to a plurality of outputs from the transformer based position sensor, and a cable peaking correction apparatus controllably coupled to the signal processing system, wherein the cable peaking correction apparatus is coupled to at least one of a transformer based position sensor excitation input and the plurality of outputs from the transformer based position sensor.

These and other features of the present invention can be best understood from the following specification and drawings, the following of which is a brief description.

DETAILED DESCRIPTION OF AN EMBODIMENT

Figure 1:
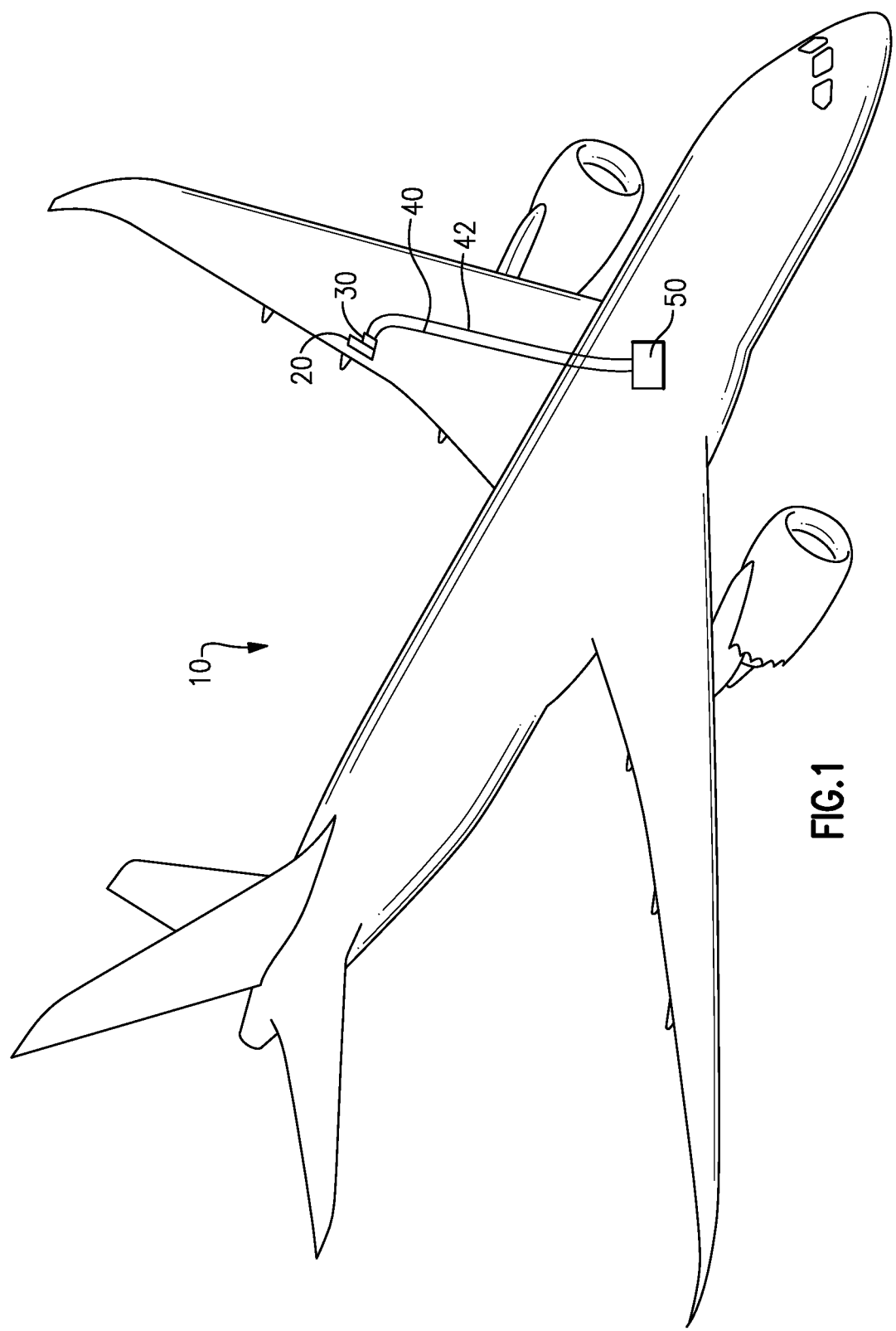
FIG. 1 schematically illustrates an aircraft including a transformer based sensor arrangement.

FIG. 1 illustrates an example aircraft 10 including an actuator 20. Connected to the actuator 20 is a transformer based sensor 30. In some examples, the sensor 30 is a linear variable differential transformer, a rotary variable differential transformer, or a resolver. The transformer based sensor 30 is connected to a processing system 50, such as an aircraft controller, via two sensor cables 40, 42. The processing system 50 determines the position of the actuator based on the relative amplitudes of the two sensor cables 40, 42, and utilizes the determined information to control the actuator 20. The transformer based sensor 30 introduces an inductance to the sensor arrangement resulting in a resistance-inductance (RL) based sensor arrangement.

Figure 2:
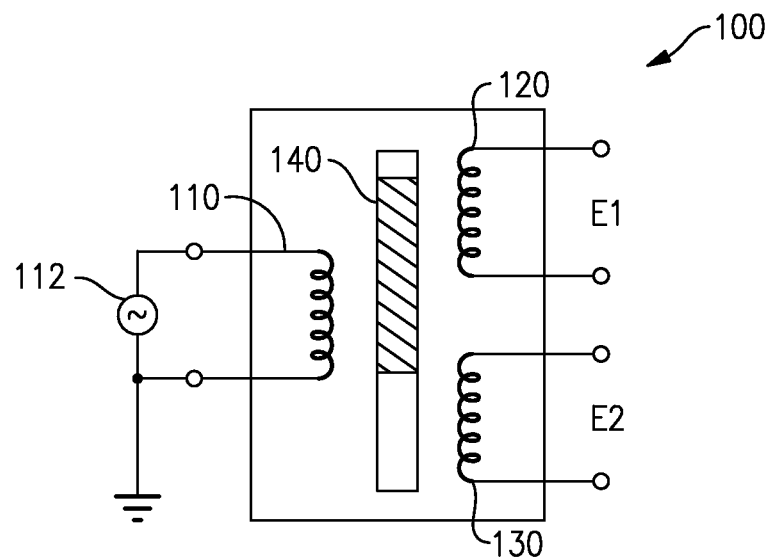
FIG. 2 schematically illustrates an example linear variable differential transformer sensor.

With continued reference to FIG. 1, FIG. 2 schematically illustrates an example linear variable differential transformer sensor 100 that can be used as the transformer based sensor 30. The linear variable differential transformer sensor 100 includes an input winding 110 connected to an AC excitation voltage source 112. Across from the input winding 110 are two output windings 120, 130 each having a corresponding output E1, E2. Between the output windings 120, 130 is a sliding magnetic core 140. The sliding magnetic core 140 is connected to an actuator and slides as the actuator moves. The shifting of the magnetic core alters the number of turns connecting each output winding 120, 130 to the input winding 110, and affects a corresponding change in the current signal output on each of the outputs E1, E2. In an alternate configuration, the core 140 remains stationary and the input winding 110 or the two output windings 120, 130 shift along with the actuator.

Figure 3:
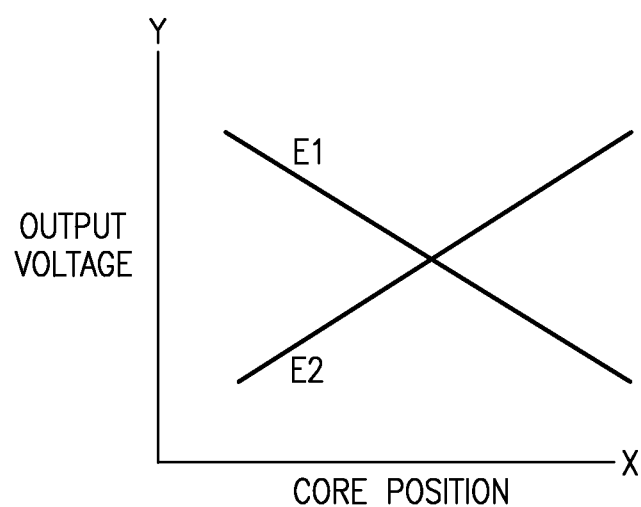
FIG. 3 is a graph illustrating an average output voltage of the example linear variable differential transformer of FIG. 2 with respect to core position.

With continued reference to FIGS. 1 and 2, FIG. 3 is a graph illustrating an output voltage of the example linear variable differential transformer based sensor 100 of FIG. 2 with respect to the position of the core 140. The core position is the X axis, and the average output voltage of the outputs E1, E2 is the y axis. As the core 140 shifts from a first minimum position to a second maximum position, the output voltage of the outputs E1, E2 shifts in a corresponding manner. Furthermore, the sum of the outputs E1, E2 is constant despite the shifting. Thus, a processing system 50 can receive both the E1 output and the E2 output and determine the exact position of the core 140 based on the relative values of the outputs E1, E2. Since the core 140 is fixed to the actuator 20 being sensed, the position of the core 140 corresponds directly to the position of the actuator 20 in a predictable manner.

Alternate arrangements, such as those utilizing a rotary variable differential transformer or a resolver in place of the linear variable differential transformer 100 as the transformer based sensor 30, can be operated in similar known manners to generate a position detection.

It is known in the art that cables, including sensor cables, have an inherent capacitance, and cables of sufficient length will introduce a capacitance into a circuit. Thus, the sensor cables 42 introduce a capacitance into the RL circuit, resulting in a resitance-inductance-capacitance (RLC) circuit. When the sensor cables 40, 42 are sufficiently long (have a sufficiently high capacitance), the sensor cables 40, 42 can cause an RLC resonance in the sensor circuit. The RLC resonance, combined with changes in inductance between the two sensor cables 40, 42 as the transformer based sensor 30 shifts positions, can introduce an error into the position determined by the sensor. The RLC resonance error occurs at a particular frequency, and the frequency is dependent on the resistance, inductance, and capacitance of the sensor circuit. This error is alternately referred to as cable peaking.

For standard applications, the error introduced as a result of the cable peaking is minimal and falls within tolerances. Some applications, however, require highly accurate sensors, and the relatively minimal RLC cable peaking can push the sensed position value of allowable tolerances. Thus, in a highly accurate sensor system the cable peaking must be accounted for.

Figure 4:
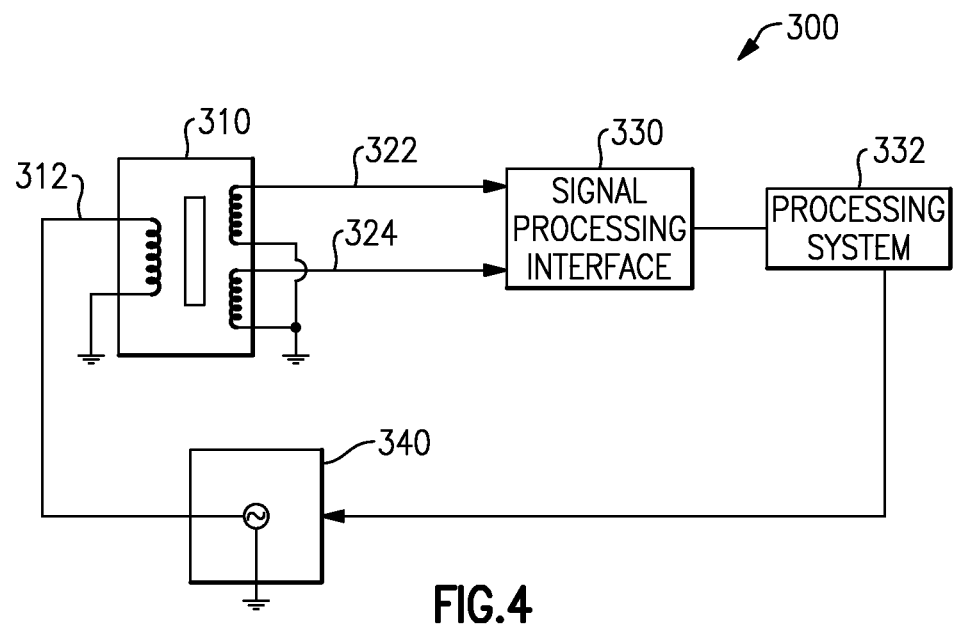
FIG. 4 schematically illustrates a first example linear variable differential transformer based sensor arrangement including a cable peaking correction circuit.

FIG. 4 schematically illustrates a first example linear variable differential transformer based sensor arrangement 300 including a cable peaking correction circuit 340. The sensor arrangement 300 includes a linear variable differential transformer sensor 310 with two outputs 322, 324. Each output 322, 324 is connected on a high node to a signal processing interface by a signal cable, and on a low node to a ground or neutral connection. The signal processing interface 330 is connected to a processing system 332 that accepts the output values and determines a position based on the relative amplitudes of the outputs 322, 324. In some examples, the signal processing interface 330 is a component of the processing system 332.

The signal cables connecting the outputs 322, 324 of the linear variable differential transformer sensor 310 to the signal processing interface 330 are sufficiently long that a capacitance is introduced into the sensor arrangement 300, resulting in the above described cable peaking. The cable peaking correction circuit 340 is connected to an excitation input 312 of the linear variable differential transformer sensor 310, and adjusts (tunes) the excitation frequency input into the linear variable differential transformer sensor 310. The cable peaking correction circuit 340 is controllably connected to the processing system 332.

The connection to the processing system 332 allows the processing system 332 to adjust the frequency of the excitation current for the linear variable differential transformer sensor 310 using the cable peaking correction circuit 340. The adjustment, in turn, allows the processing system 332 to determine the resonance frequency of the cable peaking and ensure that the excitation frequency, and thus the frequency of the sensed information, is sufficiently far from the resonant frequency that the effect of the cable peaking on the sensed data does not push the linear variable differential transformer sensor 310 out of tolerances.

Thus, the cable peaking correction circuit of FIG. 4 corrects for cable peaking by shifting the excitation frequency of the sensor 310 away from the resonant frequency of the sensor arrangement 300.

Figure 5:
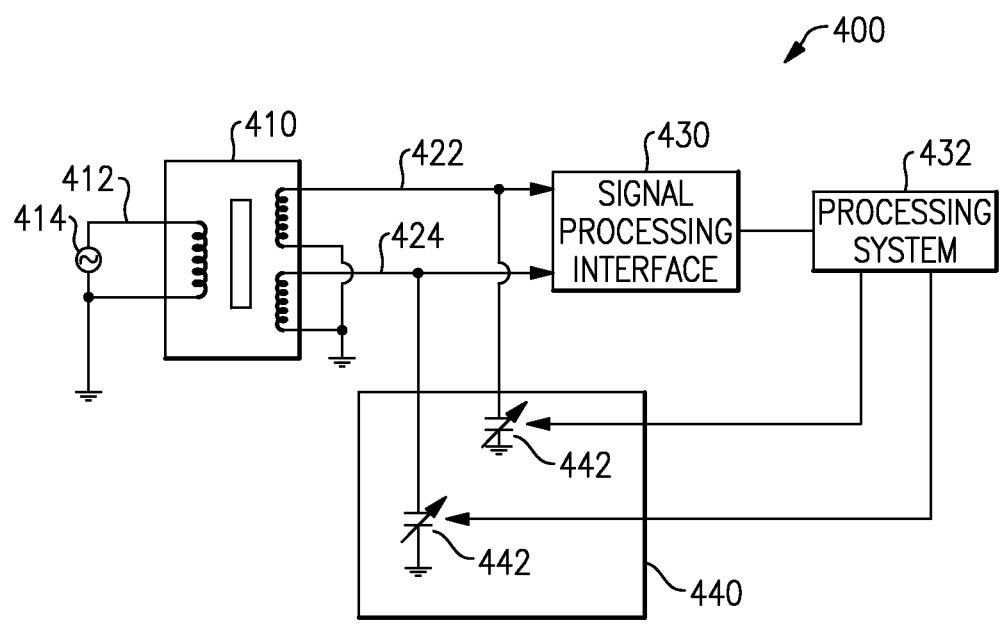
FIG. 5 schematically illustrates a second example linear variable differential transformer based sensor arrangement including a cable peaking correction circuit.
Figure 6:
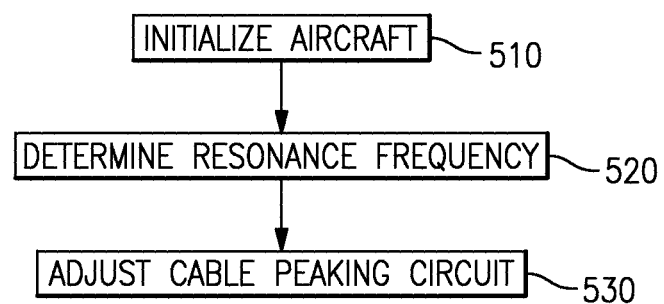
FIG. 6 is a flowchart of a method for correcting for cable peaking in an aircraft sensor.

FIG. 5 schematically illustrates a second example linear variable differential transformer based sensor arrangement 400 including a cable peaking correction circuit 440. As with the example of FIG. 4, the linear variable differential transformer based sensor arrangement 400 of FIG. 5 includes a linear variable differential transformer sensor 410, with two outputs 422, 424 connected to a signal processing interface 430. The signal processing interface 430 is connected to, and can be a part of, a processing system 432. The linear variable differential transformer sensor 410 also includes an input 412 connected to a constant excitation current generator 414.

A cable peaking correction circuit 440 of the linear variable differential transformer based sensor arrangement 400 is connected to each of the outputs 422, 424 of the linear variable differential transformer sensor 410, and includes at least one variable capacitor 442 corresponding to each of the outputs 422, 424. The variable capacitors are controllably connected to the processing system 432 such that the processing system 432 can adjust the capacitance of the variable capacitors 442. In alternate examples of the example linear variable differential transformer based sensor arrangement 400, the cable peaking correction circuit can utilize multiple capacitors arranged in a switchable capacitor bank in place of the variable capacitors 442. In the alternate arrangement, the capacitors are switched into or out of the capacitor bank, thereby adjusting the capacitance connected to the outputs 422, 424.

As with the example of FIG. 4, the processing system 432 of the linear variable differential transformer based sensor arrangement 400 determines the resonance frequency of the cable peaking and utilizes the cable peaking correction circuit 440 to adjust the sensor arrangement 400 such that the excitation frequency is sufficiently far from the resonance frequency that minimal errors are encountered. Unlike the linear variable differential transformer based sensor arrangement 300 of FIG. 4, however, the linear variable differential transformer based sensor arrangement 400 of FIG. 5 adjusts the capacitance of the cable while keeping the excitation current constant. By adjusting the capacitance of the cables connected to the outputs 422, 424, the processing system 432 can shift the resonance frequency of the sensor arrangement 400.

In a further example arrangement, each of the cable peaking correction circuits 340, 440 of FIGS. 4 and 5 can be utilized in conjunction with each other, thereby providing more accurate and redundant cable peaking correction. It is further understood that alternate transformer based sensors can be utilized in place of the linear variable differential transformer sensors 310, 410 to the same effect.

With continued reference to FIGS. 1-5, FIG. 6 illustrates a method of compensating for cable peaking in a variable differential transformer based sensor arrangement in an aircraft, such as the sensor arrangements illustrated in FIGS. 1-5. Initially, the aircraft 10 is turned on in an "Initialize Aircraft" step 510. Once the aircraft 10 is initialized, a processing system 50, 332, 432 determines the resonance frequency of the sensor arrangement 300, 400 in a "Determine Resonance Frequency" step 520. The resonance frequency can be determined using any known technique, and the appropriate method for determining the resonance frequency can be determined by one of skill in the art based on the specifications of the particular application.

Once the resonance frequency of the cable peaking is determined, the processing system 50, 332, 432 adjusts the cable peaking correction circuit in an "Adjust Cable Peaking Circuit" step 530. The adjustment ensures that the excitation frequency of the sensor 310, 410 is sufficiently far from the resonant frequency of the sensor arrangement to ensure that the error introduced by the cable peaking does not move the sensor arrangement out of tolerance.

In the example sensor arrangement 300 of FIG. 4, the aircraft is initialized with the sensor arrangement 300 operating at multiple different excitation frequencies, and the processing system 332 selects the excitation frequency with the least amount of error, thereby correcting for the current cable peaking, and allowing the adjustment to be reconfigured each time the aircraft 10 is initialized. In the example sensor arrangement 400 of FIG. 5, the processing system 432 varies the capacitors during initialization and determines the error at each of multiple capacitance values. The processing system 432 then selects the capacitance value with the lowest error, thereby adjusting the resonant frequency of the sensor arrangement 400.

While the method described above and illustrated in FIG. 6 determines the cable peaking resonant frequency on each initialization of the aircraft, it is understood that the resonant frequency will not change unless a physical component has been changed out. As such, an alternate example that performs the method during calibration after maintenance could achieve similar benefits.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A position sensor arrangement comprising:
   a transformer based position sensor;
   a signal processing system connected to a plurality of outputs from said transformer based position sensor;
   a first cable peaking correction apparatus controllably coupled to said signal processing system, wherein said first cable peaking correction apparatus is a variable frequency excitation source coupled to an input of said transformer based position sensor;
   wherein said signal processing system is operable to control an excitation frequency of said variable frequency excitation source, and wherein said variable frequency excitation source is connected to said transformer based position sensor such that said variable frequency excitation source provides an excitation current for said transformer based position sensor; and
   wherein said signal processing system is configured to cause said variable frequency excitation source to operate at multiple different excitation frequencies when said position sensor arrangement is initialized and to select one of said excitation frequencies that results in a least amount of error in a reading from said transformer based position sensor using said signal processing system.

2. The position sensor arrangement of claim 1, wherein said transformer based position sensor is a linear variable differential transformer.

3. The position sensor arrangement of claim 1, wherein said transformer based position sensor is a rotational variable differential transformer.

4. The position sensor arrangement of claim 1, wherein said transformer based position sensor is a resolver.

5. The position sensor arrangement of claim 1, further comprising a second cable peaking correction apparatus coupled to said plurality of outputs from said transformer based position sensor, and wherein said second cable peaking correction apparatus is a capacitor bank.

6. The position sensor arrangement of claim 5, wherein said capacitor bank comprises a plurality of variable capacitors, and wherein each of said variable capacitors is controllably coupled to the processing system.

7. The position sensor arrangement of claim 5, wherein at least one of said capacitors in said capacitor bank is coupled to each of said plurality of outputs from said transformer based position sensor, such that said capacitor bank is operable to adjust the capacitance of each output, and thereby adjust a cable peaking frequency of the sensor arrangement.

8. A method for correcting cable peaking in an arrangement comprising a transformer based position sensor, the method comprising:
   tuning a cable peaking correction component such that a resonant frequency of the transformer based position sensor does not place data from said transformer based position sensor out of predetermined tolerances, wherein said cable peaking correction component is a variable frequency excitation source coupled to an input of said transformer based position sensor such that said variable frequency excitation source provides an excitation current to said transformer based position sensor, wherein an excitation frequency of the variable frequency excitation source is controlled by a signal processor, wherein said tuning comprises:
      operating, by said signal processor, said variable frequency excitation source at multiple different excitation frequencies when said transformer based position sensor is initialized; and
      selecting, by said signal processor, one of said excitation frequencies that results in a least amount of error in a reading from said transformer based position sensor by said signal processor.

9. The method of claim 8, wherein said step of tuning a cable peaking correction component such that a resonant frequency of the transformer based sensor arrangement does not place data from a transformer based sensor out of specified tolerances further comprises adjusting a cable capacitance of each output of said transformer based sensor arrangement.

10. The method of claim 9, wherein said cable capacitance is adjusted by tuning a variable capacitor connected to each cable.

11. The method of claim 9, wherein said cable capacitance is adjusted by connecting at least one capacitors in a capacitor bank to each cable.

12. The method of claim 8, wherein said signal processor is an aircraft controller.

13. An aircraft sensor assembly comprising:
   a transformer based position sensor coupled to an aircraft component;

a signal processing system connected to a plurality of outputs from said transformer based position sensor; and a first cable peaking correction apparatus controllably coupled to said signal processing system, wherein said first cable peaking correction apparatus is a variable frequency excitation source and is coupled to an input of said transformer based position sensor;

wherein said signal processing system is operable to control an excitation frequency of said variable frequency excitation source, and wherein said variable frequency excitation source is connected to said transformer based position sensor such that said variable frequency excitation source provides an excitation current for said transformer based position sensor; and wherein said signal processing system is configured to cause said variable frequency excitation source to operate at multiple different excitation frequencies when said aircraft sensor assembly is initialized and to select one of said excitation frequencies that results in a least amount of error in a reading from said transformer based position sensor using said signal processing system.

14. The aircraft sensor assembly of claim 13, wherein said variable frequency excitation source is a variable excitation drive, and wherein said variable excitation drive is controlled by said signal processing system.

15. The aircraft sensor assembly of claim 13, further comprising a second cable peaking correction apparatus, wherein said second cable peaking correction apparatus is a variable capacitance capacitor bank, and wherein said variable capacitance capacitor bank is controlled by said signal processing system.

16. the method of claim 8, further comprising repeating the steps of initializing the aircraft by at least exciting the transformer based sensor arrangement, utilizing multiple excitation frequencies during said initializing, determining which excitation frequency of said multiple excitation frequencies results in the least error in the reading from said sensor using a signal processor, and adjusting the excitation frequency to said determined excitation frequency using said cable peaking correction component prior to each aircraft flight.

* * * * *